(12) United States Patent
Sander et al.

(10) Patent No.: US 10,802,053 B2
(45) Date of Patent: Oct. 13, 2020

(54) CONFIGURATION OF INTEGRATED CURRENT FLOW SENSOR

(71) Applicant: Infineon Technologies AG, Neubiberg (DE)

(72) Inventors: Rainald Sander, Munich (DE); Stephan Leisenheimer, Deisenhofen (DE); Stefan Mieslinger, Kottgeisering (DE)

(73) Assignee: Infineon Technologies AG, Neubiberg (DE)

( * ) Notice: Subject to any disclaimer, the term of this patent is extended or adjusted under 35 U.S.C. 154(b) by 111 days.

(21) Appl. No.: 15/273,382

(22) Filed: Sep. 22, 2016

(65) Prior Publication Data

US 2018/0080957 A1    Mar. 22, 2018

(51) Int. Cl.
*G01R 15/14*    (2006.01)
*H03K 17/687*    (2006.01)

(52) U.S. Cl.
CPC ....... *G01R 15/146* (2013.01); *H03K 17/6871* (2013.01)

(58) Field of Classification Search
CPC .. G01R 15/146; G01R 19/0092; G01R 1/203; G01R 31/2884; H03K 17/6871; H03K 17/0822; H03K 17/0828; H03K 2017/0806; H03K 2217/0063; G01K 7/01; H02M 2001/0009; H02M 3/1588
See application file for complete search history.

(56) References Cited

U.S. PATENT DOCUMENTS

| 4,584,525 A | 4/1986 | Harnden, Jr. et al. |
| 4,945,445 A * | 7/1990 | Schmerda .............. G01R 1/203 |
| | | 323/277 |

(Continued)

FOREIGN PATENT DOCUMENTS

| CN | 101398446 A | 4/2009 |
| CN | 101847599 A | 9/2010 |

(Continued)

OTHER PUBLICATIONS

U.S. Appl. No. 14/947,649, filed Nov. 20, 2015.

(Continued)

*Primary Examiner* — Lee E Rodak
(74) *Attorney, Agent, or Firm* — Shumaker & Sieffert, P.A.

(57) ABSTRACT

This disclosure is directed to techniques that may accurately determine the amount of current flowing through a power switch circuit by measuring the voltage across the inherent impedance of the circuit connections. One connection may include a low impedance connection between the power switch output and ground, where the low impedance connection may be on the order of milliohms. By using a four-wire measurement, the sensing connections are not in the current path, so the measured value may not be affected by the current. The connection that makes up the current path can be accomplished with a variety of conductive materials. Conductive materials may have a temperature coefficient of resistivity that may impact a measurement of electric current as the temperature changes. Measuring the temperature of the current path, along with the voltage across the connection, may allow a more accurate current measurement.

15 Claims, 5 Drawing Sheets

(56) References Cited

U.S. PATENT DOCUMENTS

| | | | | |
|---|---|---|---|---|
| 6,781,360 | B1* | 8/2004 | Dragoi | G01R 1/203 |
| | | | | 324/126 |
| 7,557,599 | B2* | 7/2009 | Graf | G01R 19/0092 |
| | | | | 324/762.07 |
| 7,852,148 | B2 | 12/2010 | Massie et al. | |
| 8,173,287 | B2 | 5/2012 | Sim | |
| 8,422,183 | B2* | 4/2013 | Ohshima | H02H 3/087 |
| | | | | 361/93.1 |
| 9,087,829 | B2 | 7/2015 | Macheiner et al. | |
| 9,350,156 | B2 | 5/2016 | Kanzaki et al. | |
| 9,768,766 | B2* | 9/2017 | Willkofer | H03K 17/0828 |
| 2002/0158615 | A1 | 10/2002 | Goodfellow et al. | |
| 2007/0164764 | A1* | 7/2007 | Billingsley | G01R 1/203 |
| | | | | 361/101 |
| 2010/0014195 | A1* | 1/2010 | Takahashi | H03K 17/0822 |
| | | | | 361/18 |
| 2011/0074383 | A1 | 3/2011 | Frederick et al. | |
| 2011/0074384 | A1 | 3/2011 | Labib et al. | |
| 2013/0060499 | A1* | 3/2013 | Yoshimura | G01K 3/14 |
| | | | | 702/99 |
| 2014/0269840 | A1* | 9/2014 | Hsiao | G01K 7/16 |
| | | | | 374/184 |
| 2015/0260760 | A1* | 9/2015 | Katakura | G01R 15/04 |
| | | | | 324/715 |
| 2015/0326000 | A1* | 11/2015 | Kanzaki | H02H 7/1257 |
| | | | | 361/101 |
| 2015/0346037 | A1* | 12/2015 | Kiep | H01L 35/34 |
| | | | | 374/178 |
| 2017/0059632 | A1* | 3/2017 | Parkman | G01R 19/32 |
| 2017/0302151 | A1* | 10/2017 | Snook | H02M 1/08 |
| 2018/0166436 | A1* | 6/2018 | Sato | H03K 17/08128 |

FOREIGN PATENT DOCUMENTS

| | | |
|---|---|---|
| CN | 102033152 A | 4/2011 |
| CN | 105098723 A | 11/2015 |
| DE | 10120524 A1 | 11/2002 |
| DE | 10343083 B4 | 3/2006 |

OTHER PUBLICATIONS

U.S. Appl. No. 14/747,382, filed Jun. 23, 2015.

"Models, How do I set up a temperature coefficient for a resistor? I would like to define a resistor that has a temperature coefficient of 1500ppm/degree C," Spectrum Software, retrieved from http://www.spectrum-soft.com/faq/help/faq127.shtm on Aug. 30, 2016, 2 pp.

Dellinger, "The Temperature Coefficient of Resistance of Copper," Bulletin of the Bureau of Standards, vol. 7, No. 1, Nov. 29, 1910, 31 pp.

Office Action, in the Chinese language, from counterpart Chinese Application No. 201710866690.2, dated Sep. 4, 2019, 13 pp.

Office Action, in the German language, from counterpart German Application No. 102017121869.6, dated Dec. 19, 2018, 13 pp.

* cited by examiner

US 10,802,053 B2

CONFIGURATION OF INTEGRATED CURRENT FLOW SENSOR

TECHNICAL FIELD

The disclosure relates to semiconductor packaging, and more specifically, to semiconductor packages for power electronics.

BACKGROUND

A half-bridge circuit may include two analog devices or switches. One or more half-bridge circuits may be used in power supplies for motors, in rectifiers, and for power conversion. Each half-bridge circuit package has several contacts and may include several conductive paths to connect the contacts to each other and to external components. Monitoring the current through a half-bridge circuit may be valuable to proper functioning of an overall system, especially for applications that include motor control. A half-bridge circuit may include an external resistor in the current path. By measuring the voltage across the external resistor, the system may accurately determine the current through the external resistor, which may approximate the current flowing through the half-bridge. External resistors may have some disadvantages including added cost and circuit complexity, as well as an added voltage drop and energy loss because of the external resistor.

A half-bridge circuit may be constructed using through-hole, integrated circuity or surface-mount technology (SMT). SMT is a production method for electronics that involves attaching components and devices on a printed circuit board (PCB). Components and devices may be soldered on the PCB to provide stability and electrical connections through the traces in the PCB.

SUMMARY

In general, the disclosure is directed to techniques for determining the current through a power switch circuit, such as a half-bridge circuit, that may include a high side and low side power transistor. The techniques of this disclosure determine the current through the power switch circuit by taking a four-wire voltage measurement across only the inherent impedance of the connections in the circuit. An example of the connections in the circuit include the circuit path from the output of a power switch to ground. The techniques of this disclosure yield accurate current measurements without the need for an added resistor located external to the power switch to monitor the current.

In one example, the disclosure is directed to a circuit comprising a power switch, wherein the power switch includes a power switch output and a power switch input and a current path, wherein the current path includes an inherent impedance and the current path connects the power switch output to a ground. The circuit further comprises a first current sense terminal and a second current sense terminal, wherein the first current sense terminal and the second current sense terminal are configured to determine an amount of current in the current path and a temperature sensor, wherein the temperature sensor is configured to determine the temperature of the current path.

In another example, the disclosure is directed to a system comprising a measuring unit, and a circuit. The circuit comprises a power switch, wherein the power switch includes a power switch output and a power switch input, a current path, wherein the current path includes an inherent impedance and the current path connects the power switch output to a ground, a first current sense terminal and a second current sense terminal, wherein the first current sense terminal and the second current sense terminal are configured to detect an amount of current in the current path, and a temperature sensor, wherein the temperature sensor is configured to detect the temperature of the current path. The measuring unit connects to the first current sense terminal, the second current sense terminal and the temperature sensor.

In another example, the disclosure is directed to a method for determining a current through a power switch the method comprising monitoring, by a processor of a measuring unit, a first current sense terminal and a second current sense terminal, wherein: the first current sense terminal connects to an output of the power switch, the second current sense terminal connects to a ground. A current path connects the output of the power switch to the ground and the current path includes an inherent impedance. The method also includes determining, by the processor, the amount of current in the current path, based on the inherent impedance of the current path, monitoring, by the processor, a temperature sensor, wherein the temperature sensor is configured to detect the temperature of the current path. The processor may determine the temperature of the current path and in response to determining, the temperature of the current path, further determining, by the processor, a corrected value of the amount of current in the current path.

The details of one or more examples of the disclosure are set forth in the accompanying drawings and the description below. Other features, objects, and advantages of the disclosure will be apparent from the description and drawings, and from the claims.

DETAILED DESCRIPTION

The techniques of this disclosure may accurately determine the amount of current flowing through a power switch circuit by measuring the voltage across the inherent impedance of the circuit connections. In one example, a half-bridge circuit may include a high side and low side power transistor. One circuit connection may include a low impedance connection between the source of the low side power transistor and ground. The low impedance connection may be on the order of milliohms, but not zero. Measuring the voltage across this connection, and knowing the resistance of the connection, one can calculate the current flowing through the power transistor and therefore through the half-bridge circuit. An electric current, on the order of an amp or more, may affect the accuracy of a voltage measurement, unless the voltage measurement is not in the current path. This disclosure describes a technique to measure the voltage across a resistance that is on the order of milliohms by using a four-wire measurement, also called a four-terminal measurement. In a four-wire measurement, the sensing connections are not in the current path, so the measured value may be unaffected by the current.

The connection that makes up the current path can be accomplished with a variety of conductive materials, such as copper, aluminum, or some other metal or conductive alloy composition. Power switch circuits may be used in a variety of applications including ground vehicles, aircraft or other applications where the operating temperature may change significantly. Most conductive materials have a temperature coefficient of resistivity that may impact a measurement of electric current as the temperature changes. Measuring the temperature of the current path, along with the voltage across the connection, may allow a more accurate current measurement. Therefore, an additional temperature sensor, such as a diode, may be useful.

A circuit that determines an accurate current flow by measuring the voltage across the inherent resistance of a connection may have advantages over other techniques of determining the amount of current. For example, such a circuit may be less costly and more manufacturable than a technique that adds an external resistor to the current path. Adding an additional temperature sensor may allow more options for the material used in the current path. A temperature sensor may allow the use of a more common and less expensive connection material, such as copper, rather than a more expensive material made of a low ohmic alloy with a low temperature coefficient.

Figure 1:
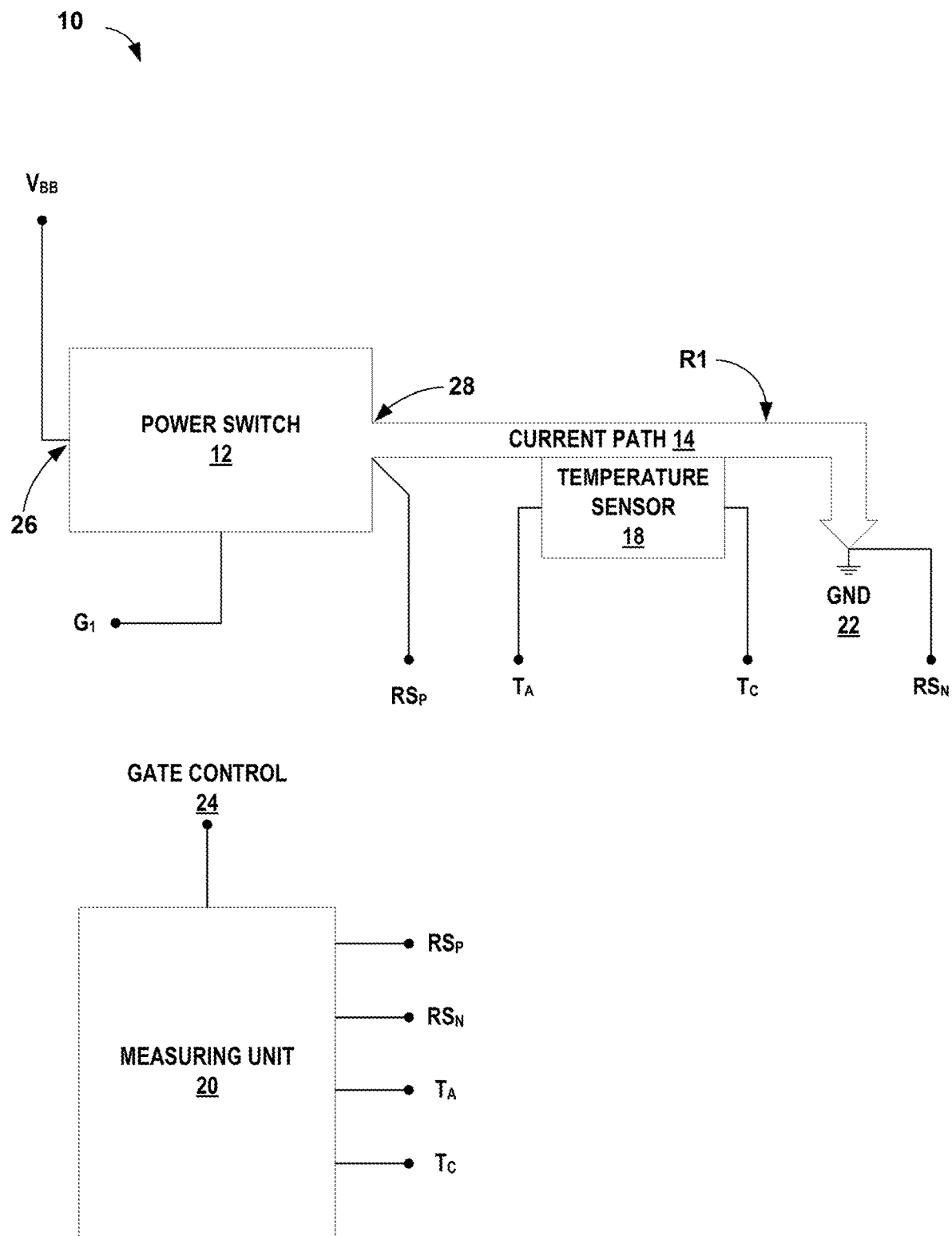
FIG. 1 is a conceptual block diagram illustrating an example system with a power switch and a current path that includes an inherent resistance and sensing terminals to determine the amount of current through the current path in accordance with the techniques of this disclosure.

FIG. 1 is a conceptual block diagram illustrating an example system with a power switch and a current path that includes an inherent resistance and sensing terminals to determine the amount of current through the current path. FIG. 1 illustrates an overview of the techniques of this disclosure.

FIG. 1 depicts system 10, which may include measuring unit 20 and a power switch circuit. The power switch circuit may include power switch 12, current path 14 with inherent resistance R1 and temperature sensor 18. Current path 14 connects an output of power switch 12 to ground 22, in the example of FIG. 1. The circuit may also include four sensing terminals. Two of the sensing terminals RSP and RSN may be used to sense the current of current path 14. Temperature sensing terminals TA and TC may be connected to the temperature sensor 18 to determine the temperature of current path 14.

System 10 depicts a portion of a system that may be used in a variety of applications using a power switch. One example may include a half-bridge circuit that may include two or more power switches, which may be used in motor control, lighting and similar systems. Some specific examples may include automotive power steering motors, heating, ventilation and air conditioning (HVAC), pumps for water, oil or other liquids, and other related applications.

System 10 may include measuring unit 20. Measuring unit 20 may be a separate module in system 10 that monitors the current sensing terminals, RSP and RSN, and the temperature sensing terminals TA and TC. In other examples, measuring unit 20 may be part of a larger control system, such as an engine control system in an automobile. Measuring unit 20 may include one or more processors that calculate the amount of current in current path 14 and temperature of current path 14. In this disclosure, a processor may include any one or more of a microprocessor, a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry.

Measuring unit 20 may also include gate control 24. In the example of FIG. 1, gate control 24 may connect to the power switch gate G1 of power switch 12. G1 is the gate terminal for power switch 12. In some examples, measuring unit 20 may output signals to gate terminal G1 to control power switch 12.

Power switch 12 may be an electronic switch such as an insulated gate bipolar transistor (IGBT), metal oxide semiconductor field effect transistor (MOSFET) or similar switch. In examples where power switch 12 is a MOSFET, power switch 12 may be a vertical MOSFET. Vertical MOSFETs are designed for switching applications. Using a vertical structure, these transistors may sustain both high blocking voltage and high current, but may have less control in the saturation region.

Power switch 12 may include a power switch input 26, a power switch output 28 and a power switch gate, G1. Power switch 12 may include a source and drain, or a collector and emitter, depending on the type of transistor. In some examples, the input of power switch 12 may be the drain while the output of power switch 12 may be the source. Power switch 12 may have other configurations depending on the application. Gate G1 may control the current flow through power switch 12.

In the example of FIG. 1, current path 14 connects power switch output 28 to ground 22. Current path 14 may include inherent resistance R1. Inherent resistance R1 may depend on the type of material used as well as the size and shape of current path 14. In some examples, current path 14 may be a copper clip that connects power switch output 28 to another point in a circuit. In the example of FIG. 1, current path 14 connects power switch output 28 to ground 22, however, current path 14 may connect to any other point in a circuit, depending on the application. In other examples, current path 14 may be a wire bond or a clip made of some conductive alloy, such as a copper or aluminum based alloy. In the example of a wire bond, current path 14 may include two or more wire bonds to reduce the overall inherent resistance R1 and increase the current carrying capacity of current path 14.

Each type of material, as well as the dimensions of the connection, will impact inherent resistance R1. For example, compare a first copper clip with length L1 and cross sectional area A1 to a second copper clip with length L2 and cross sectional area A2. A longer copper clip, e.g. L1>L2 will tend to make the inherent resistance of the first copper clip greater than the second copper clip. A larger cross sectional area e.g. A1>A2 will tend to make the inherent resistance of the first copper clip less than the second copper clip. Selection of current path dimensions and material depends on the application. A current path with a lower inherent resistance may have advantages over a current path with a higher resistance. Selecting a very low resistance material may have advantages in circuit performance, but may cost significantly more than a material such as copper.

Current path 14 may include current sense terminals RSP and RSN. In the example of FIG. 1, current sense terminal RSP connects to power switch output 28, while current sense terminal RSN connects to ground 22. Current sense terminals RSP and RSN connect to current path 14 but are not part of current path 14. In this way current sense terminals RSP and RSN may accurately monitor the voltage across inherent resistance R1 without being affected by the current flowing through current path 14. This measurement technique may be called a four-wire or four-terminal voltage measurement. By monitoring the voltage across a known inherent resistance R1, current sense terminals RSP and RSN may allow measurement unit 20 to accurately calculate the amount of current in current path 14 according to Ohm's law ($V = I \times R$). Current sense terminal RSP may detect the voltage at power switch output 28. Current sense terminal RSN may detect the voltage at ground 22. Measurement unit 20 may subtract the voltages detected by current sense terminals RSP and RSN to calculate the voltage across inherent resistance R1 and determine the amount of current in current path 14. Note that though the example of FIG. 1 depicts current path 14 connecting power switch 12 to ground 22, in other examples current path 14 may connect power switch 12 to any point in a larger circuit or system.

Temperature sensor 18 may be located close to current path 14 to accurately monitor the temperature of current path 14. In the example of FIG. 1, temperature sense terminal TA and TC may connect to measurement unit 20. Measurement unit 20 may monitor temperature sense terminals TA and TC and calculate the temperature of current path 14. Measurement unit 20 may also use the temperature coefficient of resistance of the material used for current path 14 to apply a correction to the amount of current flowing through current path 14. Examples of temperature sensor 18 will be described in more detail below.

In other examples, not shown in FIG. 1, current path 14 may connect power switch input 26 to a supply voltage VBB. In such an example, current path 14 may still include inherent resistance R1. In this example current sense terminal RSP may connect to supply voltage VBB instead of to power switch output 28. Similarly, current sense terminal RSN may connect to power switch input 26 instead of to ground 22. As described above, temperature sensor 18 may be located close enough to current path 14 to accurately measure the temperature of current path 14. In this way measurement unit 20 may determine the amount of current flowing through current path 14 and apply a temperature correction, in a similar manner to that described above.

A system according to the techniques of this disclosure, such as system 10 may have advantages over other techniques because system 10 may accurately measure the current in a power switch without the need for external resistor. Accurately determining the current in a power switch may be useful in many applications. For example, a motor control circuit may include one or more half-bridges with power switches. A motor control circuit that can accurately monitor the current flowing through each half bridge may have advantages over other motor control circuits. A system that can accurately measure current using the inherent resistance of one or more current paths may be less costly because of fewer components. Such as system may also be more simple and more reliable to manufacture.

For circuits that operate in the high frequencies, such as in the radio frequency (RF) range, it may be important to differentiate between a temperature coefficient of impedance and a temperature coefficient of resistivity. At higher frequencies inherent inductance and parasitic capacitance may play a larger role then at lower frequencies. In this disclosure the terms impedance and resistance or resistivity may be used interchangeably, unless otherwise noted.

Figure 2A:
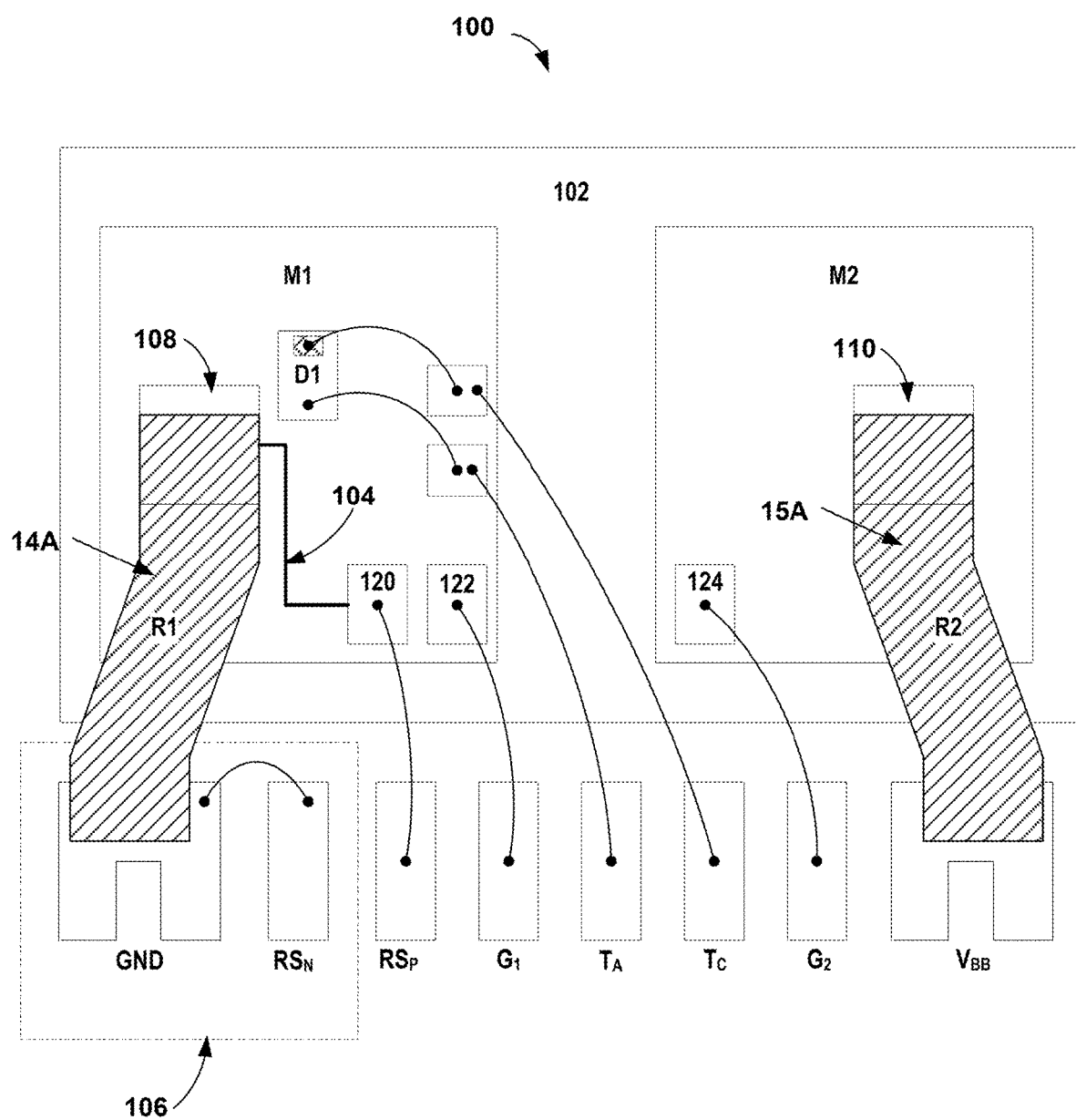
FIG. 2A is a conceptual diagram illustrating an example circuit using the inherent resistance in a circuit path to determine the current in the circuit path, in accordance with one or more techniques of this disclosure.

FIG. 2A is a conceptual diagram illustrating an example circuit using the inherent resistance in a circuit path to determine the current in the circuit path, in accordance with one or more techniques of this disclosure. Features in FIG. 2 with the same the same reference designations as in FIG. 1 have the same function. For example, temperature sense terminals TA and TC in FIG. 2A perform the same function as temperature sense terminals TA and TC in FIG. 1.

Circuit 100 may include substrate 102, transistors M1 and M2, current paths 14A and 15A and terminals GND, RSN, RSP, G1, TA, TC, G2 and VBB. Substrate 102 and the listed terminals may be part of a leadframe assembly, a printed circuit board (PCB) or similar structure that includes both conductive and non-conductive portions to physically support and electrically connect circuit elements.

Figure 3B:
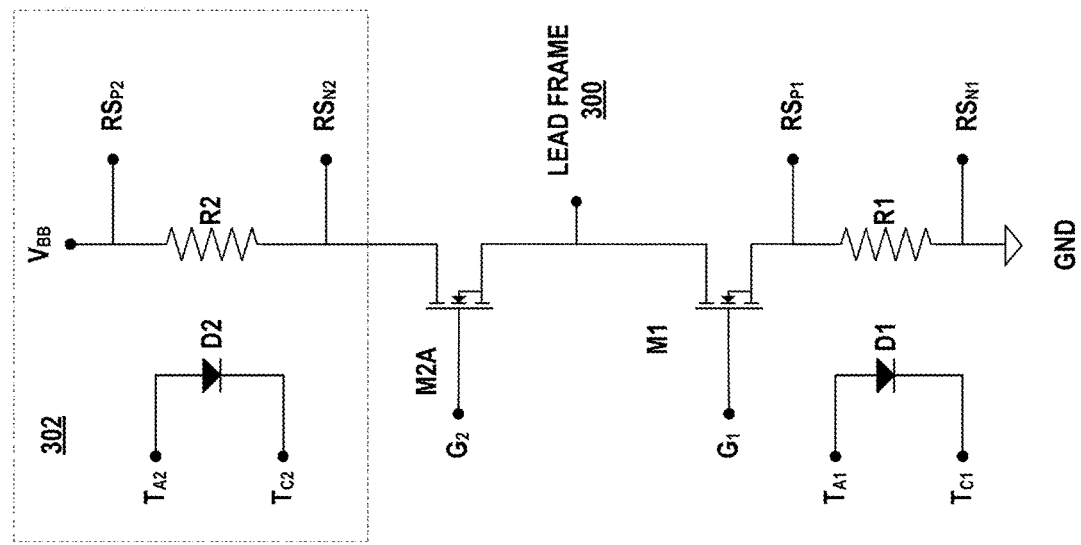
FIG. 3B is a schematic diagram illustrating another example circuit with a current path that includes an inherent resistance and sensing terminals to determine the amount of current through the current path.
Figure 3A:
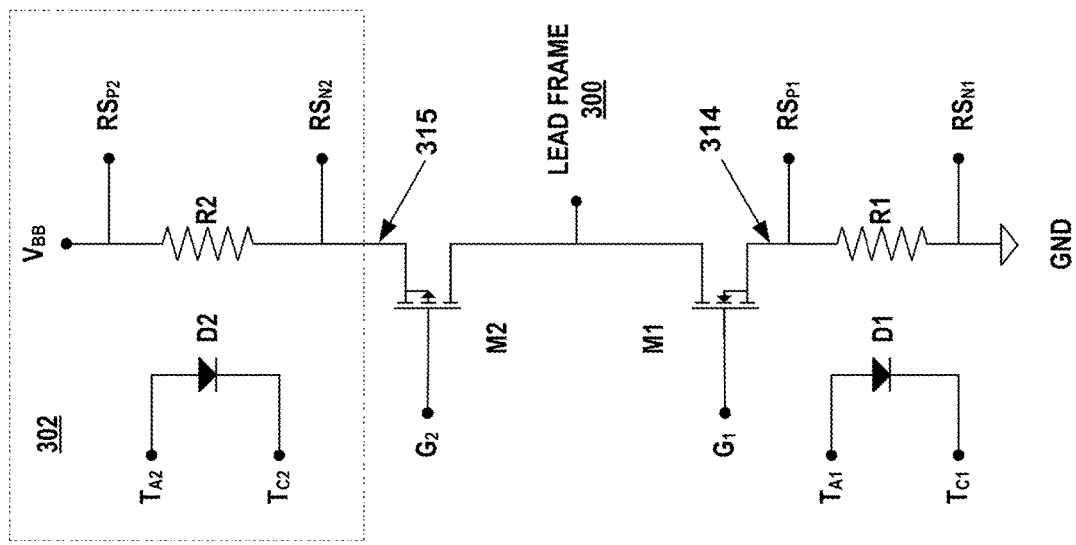
FIG. 3A is a schematic diagram illustrating an example circuit with a current path that includes an inherent resistance and sensing terminals to determine the amount of current through the current path in accordance with the techniques of this disclosure.

The example of FIG. 2A depicts circuit 100 as a half bridge circuit using two power switches, similar to that shown in schematic form in FIG. 3A. As described above, a half bridge circuit may be used in a variety of ways such as motor control, power converter, and similar applications.

The example of FIG. 2A depicts the power switches as transistors M1 and M2. Transistors M1, M2 may comprise n-type transistors or p-type transistors, and transistors M1, M2 may comprise vertical power transistors. For a vertical power transistor, the source terminal and the drain terminal may be on opposite sides or opposite surfaces of the transistor. Current in a vertical power transistor may flow through the transistor from top to bottom or from bottom to top. In some examples, transistors M1, M2 may comprise other analog devices such as diodes. Transistors M1, M2 may also include freewheeling diodes connected in parallel with transistors to prevent reverse breakdown of transistors M1, M2. In some examples, transistors M1, M2 may operate as switches or as analog devices. In still other examples, circuit 100 may include more than two transistors, such as in multi-phase power converters or other more complex power circuits. For example, in a multi-phase power converter, each phase may have a half bridge with one high-side transistor and one low-side transistor. Therefore, a multi-phase power converter, or a multi-phase motor control circuit may include one or more replications of the half bridge as depicted in FIG. 2A. Transistors M1, M2 may comprise various material compounds, such as silicon (Si), silicon carbide (SiC), Gallium Nitride (GaN), or any other combination of one or more semiconductor materials.

Transistor M2 as shown in the example of FIG. 2A, is a vertical power MOSFET with a source 110, gate pad 124. The drain of transistor M1 (not shown) is electrically connected to substrate 102. Throughout this description, electrical connections may be completed with solder, including silver solder, conductive adhesive, such as conductive epoxy or connected by similar means, unless otherwise noted. For example, gate pad 124 electrically connects to gate terminal G2 with one or more wire bonds.

Transistor M1 includes a source 108, gate pad 122 and drain (also not shown) similar to transistor M2. Gate pad 122 connects to gate terminal G1. G1 is the power switch gate for transistor M1. Transistor M1 includes additional connections and components. Transistor M1 includes diode D1, which is used as a temperature sensor, similar to temperature sensor 18 shown in FIG. 1. The cathode of D1 connects to temperature sensor terminal TC. The anode of D1 connects to temperature sensor terminal TA. Transistor M1 also includes a current sense pad 120, which is electrically connected to source 108 through conductive trace 104. Trace 104 may be on a different layer of transistor M1 than current sense pad 120 or source 108. Current sense pad 120 connects to current sense terminal RSP with one or more wire bonds, in this example.

In the example of FIG. 2A, source 108 of transistor M1 is the output of the half bridge in circuit 100. Source 108 functions similar to power switch output 28 in FIG. 1. Current path 14A connects source 108 to ground terminal GND. Current path 14A as depicted in FIG. 2A is a conductive clip, such as a copper clip, soldered or otherwise electrically bonded to source 108 on one end and ground GND on the other. Current path 14A includes inherent resistance R1, which is similar to R1 shown in FIG. 1. The value of inherent resistance R1 depends on the materials and dimensions of the conductive clip that makes up current path 14A. Current sense terminal RSN connects to ground GND by one or more wire bonds. Note as described above for FIG. 1, current sense terminals RSP and RSN are configured to detect the voltage across inherent resistance R1. Current sense terminals RSP and RSN connect to current path 14A, but are configured so the current through current path 14A will not affect the voltage measurement.

In operation, current sense terminals RSP and RSN connect to a measurement unit, such as measurement unit 20 shown in FIG. 1. The measurement unit may monitor current sense terminals RSP and RSN to detect the voltage at each terminal. The measurement unit may then accurately calculate the current through current path 14A, as described above, without an additional external resistance. The measurement unit may correct the calculated amount of current through current path 14A based on calculating the temperature of current path 14A. As described above, the measurement unit may monitor temperature sense terminals TA and TC, which are connected to diode D1, to determine the temperature of current path 14A. Determining the amount of current through current path 14A will approximately determine the amount of current through the half bridge portion of circuit 100, within manufacturing and measurement tolerances.

Though not shown in FIG. 2A, in some examples transistor M2 may include similar additional sense pads as shown for transistor M1. Current path 15A connects the supply voltage VBB to the source 110 of transistor M2. In the example of FIG. 2A, Source 110 acts similar to power switch input 26 as shown in FIG. 1. As described above, transistor M2 may include current sense terminals to determine the amount of current in current path 15A by measuring the voltage across inherent resistance R2. Similarly, transistor M2 may include a temperature sensor with temperature sense terminals to calculate the temperature of current path 15A. In some examples transistor M2 may include the temperature and current sense terminals while transistor M1 has no such sense terminals. In other examples both transistor M1 and M2 include temperature and current sense terminals. For example, in an application such as a self-driving or autonomous automobile, a power steering motor control may include sense terminals for both M1 and M2 in each half bridge in the motor control circuit.

Figure 2C:
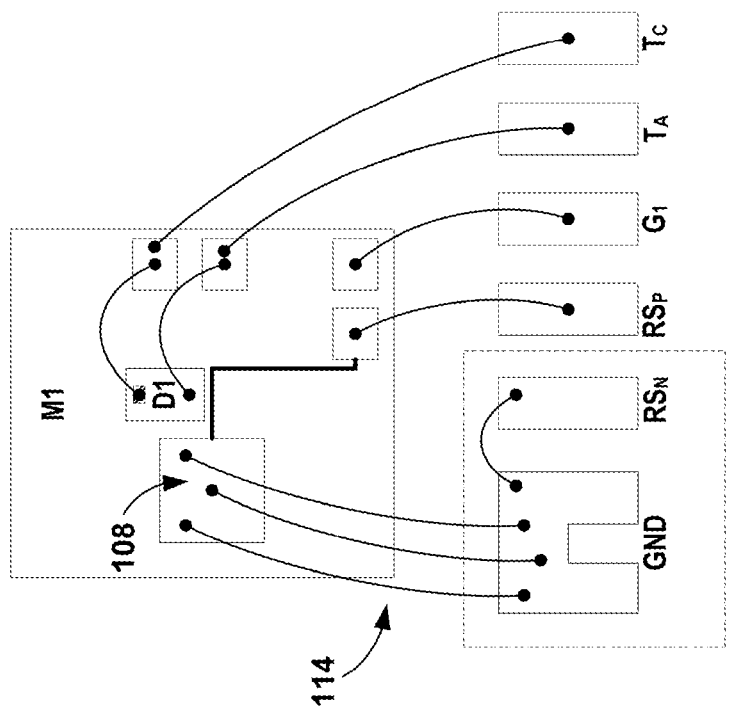
FIGS. 2B and 2C are conceptual diagrams that illustrate other examples for connecting the current sense terminals.
Figure 2B:
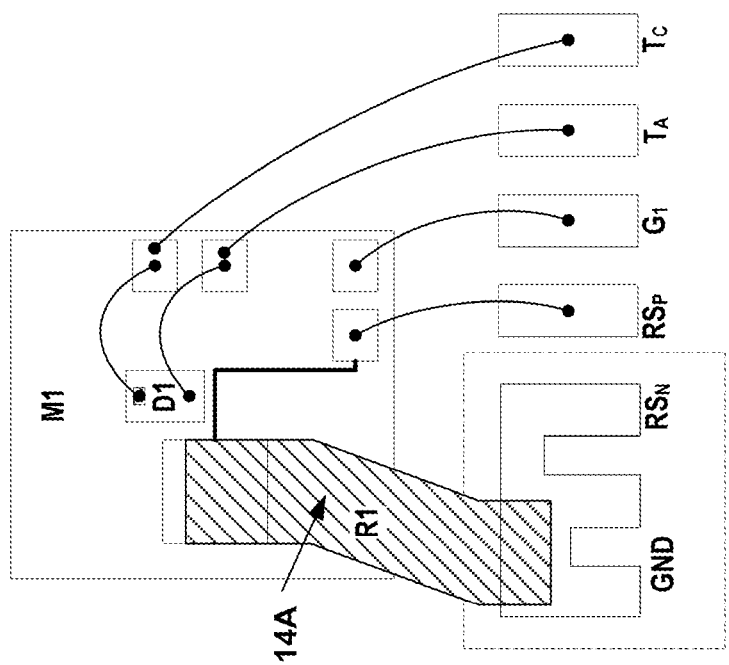

FIGS. 2B and 2C are conceptual diagrams that illustrate other examples for connecting the current sense terminals. FIG. 2A depicts ground GND and current sense terminal RSN, as enclosed by area 106, connected with at least one wire bond. FIG. 2B depicts the RSN connection to ground GND with a leadframe terminal. The leadframe terminal, as shown by area 112, is configured to electrically connect RSN to ground GND, but still ensure that RSN is not in current path 14A. This has the advantage of the RSN measurement to be unaffected by the current through the current path. FIG. 2C illustrates a similar connection between current sense terminal RSN and ground GND as that shown by area 106 in FIG. 2A. However, FIG. 2C illustrates an example current path 114 as a plurality of wire bonds between the ground terminal GND and source 108. Example current path 114 includes an inherent resistance that may differ from that of current path 14A which uses a conductive clip. Note that though FIGS. 2A-2C depict the power switch output (source 108) connected to ground GND, in other examples a power switch output may connect to any point in a larger circuit or system, and not necessarily to a ground terminal.

FIG. 3A is a schematic diagram illustrating an example circuit with a current path that includes an inherent resistance and sensing terminals to determine the amount of current through the current path in accordance with the techniques of this disclosure. FIG. 3 illustrates two power switches configured as a half bridge, however other circuit configurations that include a current path with a known inherent resistance are also within the scope of this disclosure.

The example circuit of FIG. 3A includes transistors M1 and M2 that are configured the same as the transistors in circuit 100 depicted in FIG. 2A. The drain of M1 connects to the drain of M2 through leadframe 300. Gate terminals G1 and G2 control the current flow through transistors M1 and M2 respectively. Gate terminals G1 and G2 are the power switch gates for transistors M1 and M2. Current path 314 connects the source of M1 to ground GND. The source of M1 is similar to power switch output 28 depicted in FIG. 1. Current path 314 includes inherent resistance R1 and current sense terminals RSP1 and RSN1, which have the same functions and characteristics as inherent resistance R1 and current sense terminals RSP and RSN described above in FIGS. 1-2C. In other words, RSP1 and RSN1 are configured as a four-wire measurement to determine the amount of current through current path 314.

The example of FIG. 3A depicts diode D1 with temperature sense terminals TA1 and TC1, connected to the anode and cathode respectively of diode D1. Diode D1 is located near current path 314 to detect the temperature of current path 314. This is similar to the arrangement of diode D1 described above in FIG. 2A as well as temperature sensor 18 from FIG. 1. Temperature sense terminals TA1 and TC1 may connect to a measurement unit, similar to measurement unit 20 shown in FIG. 1.

Current path 315 connects the source of M2 to supply voltage VBB. The source of M2 is similar to power switch input 26 shown in FIG. 1 and supply voltage VBB performs the same function as supply voltage VBB shown in FIGS. 1-2A. Current path 315 includes inherent resistance R2. As depicted by area 302, in some examples current path 315 may also include current sense terminals RSP2 and RSN2. Current sense terminals RSP2 and RSN2 are configured as a four-wire measurement to determine the amount of current through current path 315. The four-wire configuration of current sense terminals RSP2 and RSN2 has the same functions and characteristics as current sense terminals RSP1 and RSN1 as well as current sense terminals RSP and RSN described above in FIGS. 1-2C.

Current path 315 may also include diode D2 and temperature sense terminals TA2 and TC2. Diode D2 is configured to detect and monitor the temperature of current path 315. Temperature sense terminals TA2 and TC2 along with current sense terminals RSP2 and RSN2 may connect to a measurement unit to determine the amount of current in current path 315, without requiring an external resistor. In some examples the sense terminals in area 302 may replace the sense terminals that monitor the amount of current in current path 314 and transistor M1. In other examples, a measurement unit may connect to current sense terminals for both current path 314 as well as current path 315. The measurement unit may determine the amount of current in both current paths 314 and 315 and make temperature corrections based on connections to diodes D1 and D2.

As described above, determining the current through a half bridge circuit, such as that used for a motor control, power converter or other application may be useful. Determining the current through the half bridge circuit by measuring the voltage across a known inherent resistance of one or more current paths may have advantages over other techniques of measuring current. For example, determining the current through a power switch according to the techniques of this disclosure may have advantages over including an external resistor in the current path to determine the amount of current. These advantages may include better reliability, improved manufacturability and lower cost.

FIG. 3B is a schematic diagram illustrating another example circuit with a current path that includes an inherent resistance and sensing terminals to determine the amount of current through the current path. In FIG. 3B, the source of transistor M2A connects to the drain of transistor M1. Current path 315 connects the drain of transistor M2A to supply voltage VBB. Otherwise all components and functions are the same as described in FIG. 3A. Transistor M2A is configured as an n-channel transistor. In transistor M2A, the n-conductive material may have the benefit of a higher electron-mobility compare to p-conductive material. Therefore, an n-channel transistor may have the advantage of a lower switch-on resistance for the same chip size as when compared to the p-channel transistor M2.

Although FIGS. 3A-3B depict transistors M1 and M2 with a MOSFET symbol, any electrical device controlled by a voltage may be used in place of the MOSFET as shown. For example, transistors M1, M2 may include, but not limited to, any type of field-effect transistor (FET), a bipolar junction transistor (BJT), an insulated-gate bipolar transistor (IGBT), a high-electron-mobility transistor (HEMT), a gallium-nitride (GaN) based transistor, or another element that uses voltage for its control.

Figure 4:
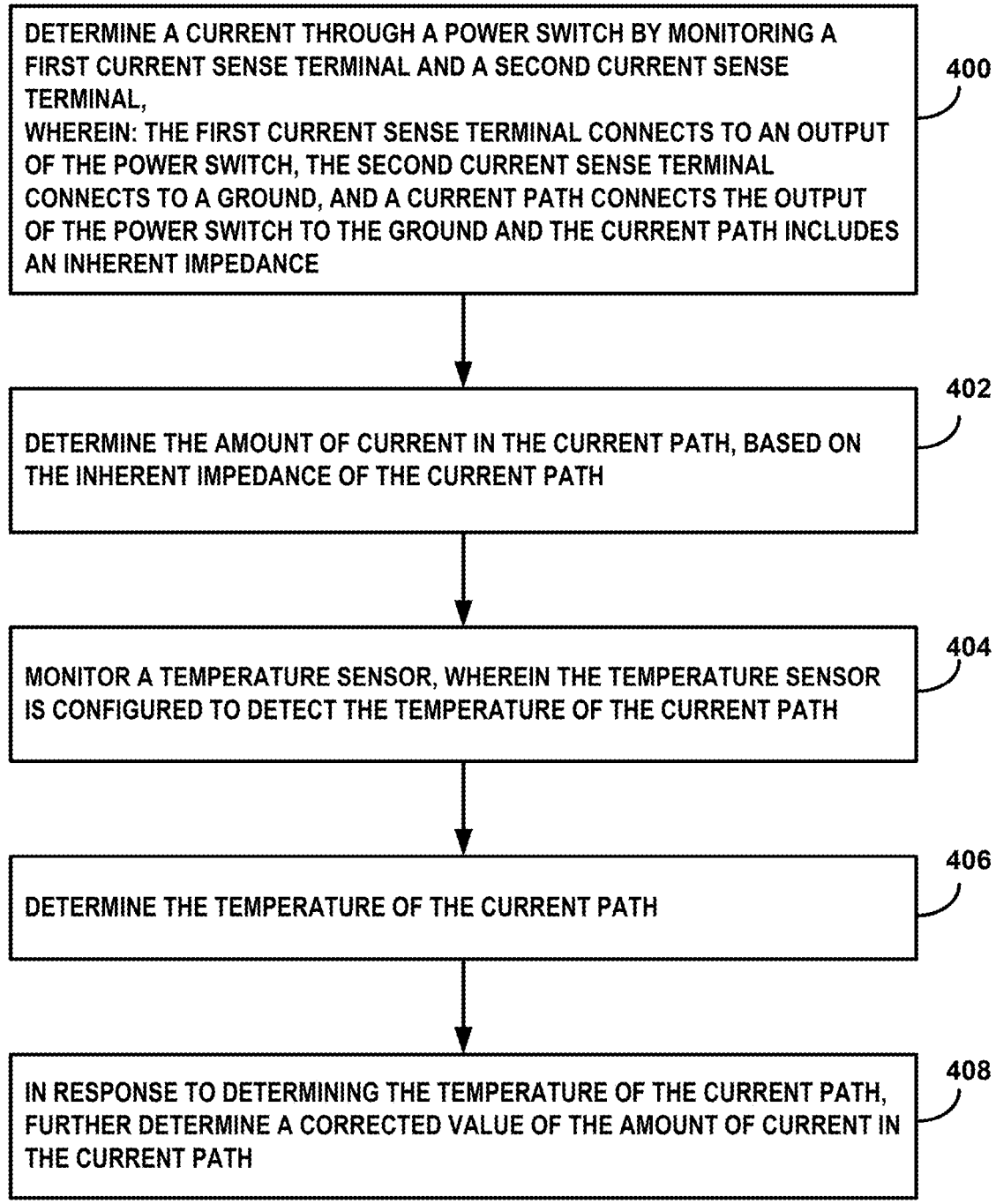
FIG. 4 is a flowchart illustrating an example technique to determine the current through a power switch, in accordance with this disclosure.

FIG. 4 is a flowchart illustrating an example technique to determine the current through a power switch, in accordance with this disclosure. The example technique of FIG. 4 will be discussed in terms of the example half bridge circuit depicted by FIG. 3A.

To determine a current through a power switch, monitor a first current sense terminal RSP1 and a second current sense terminal RSN1 (400). As shown in FIG. 3A, and similarly in FIGS. 1-2C, the current sense terminals measure the voltage across inherent resistance R1 of current path 314. The first current sense terminal RSP1 connects to the source of M1, which is the output of the power switch. The second current sense terminal RSN1 connects to ground GND.

In the examples of FIGS. 1-3B, the amount of current in the current path is the approximately same as the amount of current through the power switch, transistor M1, within manufacturing and measurement tolerances. By measuring the voltage across a known inherent resistance R1 of current path 314, determine the amount of current in current path 314 (402) according to Ohm's Law.

A measuring unit, such as measuring unit 20 shown in FIG. 1, may monitor the temperature sense terminals TA1 and TC1 connected to the temperature sensor, diode D1. Diode D1 is located close enough to current path 314 to accurately detect the temperature of current path 314 (404). The measuring unit may determine the temperature of current path 314 by performing calculations on the information received from temperature sense terminals TA1 and TC1 (406).

In response to the measuring unit determining the temperature of current path 314, the measuring unit may further determine a corrected value of the amount of current in the current path (408). This corrected value may be based on the temperature coefficient of the current path material.

The example technique depicted by FIG. 4 may have advantages over other techniques. By correcting for the temperature coefficient, the techniques of this disclosure may allow the use of lower cost materials for the current path, yet still allow accurate measurement of the amount of current in the current path.

Example 1

A circuit comprising: a power switch, wherein the power switch includes a power switch output and a power switch input; a current path, wherein the current path includes an inherent impedance and the current path connects the power switch output to a ground; a first current sense terminal and a second current sense terminal, wherein the first current sense terminal and the second current sense terminal are configured to determine an amount of current in the current path; and a temperature sensor, wherein the temperature sensor is configured to determine the temperature of the current path.

Example 2

The circuit of example 1, wherein the first current sense terminal connects to the power switch output and the second current sense terminal connects to the ground.

Example 3

The circuit of any of examples 1-2 or combinations thereof, wherein the current path is a first current path that includes a first inherent resistance and the temperature sensor is a first temperature sensor; and further comprising: a second current path, wherein the second current path includes a second inherent resistance and the second current path connects the power switch input to a supply voltage; a third current sense terminal and a fourth current sense terminal, wherein the third current sense terminal and the fourth current sense terminal are configured to determine an amount of current in the second current path; and a second temperature sensor, wherein the second temperature sensor is configured to determine the temperature of the second current path.

Example 4

The circuit of any of examples 1-3 or combinations thereof, wherein the third current sense terminal connects to the power switch input and the fourth current sense terminal connects to the supply voltage.

Example 5

The circuit of any of examples 1-4 or combinations thereof, wherein the power switch is a first power switch, and further comprising a second power switch, wherein the second power switch includes a second power switch output and a second power switch input, and wherein: the second power switch output connects to the first power switch input, the second power switch input connects to a supply voltage.

Example 6

The circuit of any of examples 1-5 or combinations thereof, wherein the current path is a first current path that includes a first inherent resistance and the temperature sensor is a first temperature sensor; wherein the second power switch input connection to the supply voltage comprises a second current path with a second inherent impedance, and further comprising: a third current sense terminal and a fourth current sense terminal, wherein the third current sense terminal and the fourth current sense terminal are configured to determine an amount of current in the second current path; and a second temperature sensor, wherein the second temperature sensor is configured to determine the temperature of the second current path.

Example 7

The circuit of any of examples 1-6 or combinations thereof, wherein the third current sense terminal connects to the power switch input and the fourth current sense terminal connects to the supply voltage.

Example 8

The circuit of any of examples 1-2 or combinations thereof, further comprising an output terminal of the circuit, wherein the current path connects the power switch output to the output terminal of the circuit, and the second current sense terminal connects to the output terminal of the circuit.

Example 9

The circuit of any of examples 1-8 or combinations thereof, wherein the power switch is a metal oxide semiconductor field effect transistor (MOSFET).

Example 10

A system comprising: a measuring unit; and circuit comprising: a power switch, wherein the power switch includes a power switch output and a power switch input; a current path, wherein the current path includes an inherent impedance and the current path connects the power switch output to a ground; a first current sense terminal and a second current sense terminal, wherein the first current sense terminal and the second current sense terminal are configured to detect an amount of current in the current path; and a temperature sensor, wherein the temperature sensor is configured to detect the temperature of the current path; and wherein the measuring unit connects to the first current sense terminal, the second current sense terminal and the temperature sensor.

Example 11

The system of example 10, wherein the power switch further comprises a power switch gate and the measuring unit further comprises a processor and a gate control output, wherein the gate control output connects to the power switch gate, and the processor is configured to: monitor the first current sense terminal and the second current sense terminal and determine the amount of current in the current path; in response to determining the amount of current in the current path, control the amount of current in the current path by outputting a signal to the power switch gate.

Example 12

The system of any of examples 10-11 or combinations thereof, wherein the processor is further configured to: monitor the temperature sensor to determine the temperature of the current path; in response to determining the temperature of the current path, control the amount of current in the current path by outputting a signal to the power switch gate.

Example 13

The system of any of examples 10-12 or combinations thereof, wherein the current path comprises a current path material, the inherent impedance of the current path depends on the current path material and the processor is further configured to control the amount of current in the current path based at least in part on the current path material.

Example 14

The system of any of examples 10-13 or combinations thereof, further comprising a current path output terminal, wherein the current path connects the power switch output to the current path output terminal, and the second current sense terminal connects to the current path output terminal.

Example 15

The system of any of examples 10-14 or combinations thereof, wherein the current path material comprises a metal or alloy composition.

Example 16

The system of any of examples 10-15 or combinations thereof, wherein the metal or alloy composition comprises one or more of copper or aluminum.

Example 17

The system of any of examples 10-16 or combinations thereof, wherein the current path material includes a temperature coefficient of impedance, and the processor is further configured to determine a corrected value of the amount of current in the current path based at least in part on the temperature coefficient of impedance of the current path material.

Example 18

A method for determining a current through a power switch, the method comprising, monitoring, by a processor of a measuring unit, a first current sense terminal and a second current sense terminal, wherein: the first current sense terminal connects to an output of the power switch, the second current sense terminal connects to a ground, and a current path connects the output of the power switch to the ground and the current path includes an inherent impedance; determining, by the processor, the amount of current in the current path, based on the inherent impedance of the current path; monitoring, by the processor, a temperature sensor, wherein the temperature sensor is configured to detect the temperature of the current path; determining, by the processor, the temperature of the current path; in response to determining, by the processor, the temperature of the current path, further determining, by the processor, a corrected value of the amount of current in the current path.

Example 19

The method of example 18, wherein the current path comprises a current path material, and the current path material includes a temperature coefficient of impedance, the method further comprising determining, by the processor, the corrected value of the amount of current in the current path based at least in part on the temperature coefficient of impedance of the current path material.

Example 20

The method of any of examples 18-19 or combinations thereof, wherein the power switch comprises a power switch gate, the method further comprising controlling, by the processor, the amount of current in the current path by outputting a signal to the power switch gate.

Various embodiments of the disclosure have been described. These and other embodiments are within the scope of the following claims.

The invention claimed is:

1. A circuit comprising:
   a power switch, wherein the power switch includes a power switch output terminal and a power switch input terminal;
   a current path comprising a conductor,
     wherein the conductor includes an inherent impedance,
     wherein the inherent impedance of the current path depends on the current path material and the current path material defines a temperature coefficient of impedance,
     wherein the current path connects the power switch output terminal to a ground terminal, and
     wherein the current path is configured to carry current between the power switch output terminal and the ground terminal;
   a first current sense terminal and a second current sense terminal,
     wherein the first current sense terminal electrically connects to the power switch output terminal, and
     wherein the second current sense terminal electrically connects to the ground terminal,
     wherein the electrical connection of the first current sense terminal and the second current sense terminal are configured to determine a voltage across the inherent impedance of the conductor without being affected by the current in the current path; and
   a temperature sensor,
     wherein the temperature sensor is configured to determine the temperature of the inherent impedance of the current path and output the temperature via temperature sensing terminals, and
   wherein the circuit is configured to receive signals to control the current in the current path based on a corrected value of the amount of current in the current path, wherein:
     the corrected value of the amount of current is based on the output temperature, and
     the corrected value of the amount of current is based at least in part on the temperature coefficient of impedance of the current path material.

2. The circuit of claim 1, wherein the first current sense terminal connects to the power switch output terminal and the second current sense terminal connects to the ground terminal.

3. The circuit of claim 1,
   wherein the current path is a first current path that includes a first inherent resistance and the temperature sensor is a first temperature sensor;
   and further comprising:
   a second current path comprising a second conductor, wherein the second conductor includes a second inherent resistance and the second current path connects the power switch input to a supply voltage;
   a third current sense terminal and a fourth current sense terminal, wherein the third current sense terminal and the fourth current sense terminal are configured to provide electrical connections to the second current path in order to determine a voltage across the second inherent impedance of the second current path; and
   a second temperature sensor, wherein the second temperature sensor is configured to determine the temperature of the second inherent impedance of the second current path.

4. The circuit of claim 3, wherein the third current sense terminal connects to the power switch input and the fourth current sense terminal connects to the supply voltage.

5. The circuit of claim 1, wherein the power switch is a first power switch, and further comprising a second power switch, wherein the second power switch includes a second power switch output terminal and a second power switch input, and wherein:
   the second power switch output terminal connects to the first power switch input,
   the second power switch input connects to a supply voltage.

6. The circuit of claim 5,
   wherein the current path is a first current path that includes a first inherent resistance and the temperature sensor is a first temperature sensor;
   wherein the second power switch input connection to the supply voltage comprises a second current path with a second inherent impedance, and further comprising:
   a third current sense terminal and a fourth current sense terminal, wherein the third current sense terminal and the fourth current sense terminal are configured to determine an amount of current in the second current path; and
   a second temperature sensor, wherein the second temperature sensor is configured to determine the temperature of the second current path.

7. The circuit of claim 6, wherein the third current sense terminal connects to the second power switch input and the fourth current sense terminal connects to the supply voltage.

8. The circuit of claim 1, wherein the second current sense terminal connects to the ground terminal via a leadframe terminal.

9. The circuit of claim 1 wherein the second current sense terminal connects to the ground terminal via a wire bond connection.

10. A system comprising:
a circuit comprising:
   a power switch, wherein the power switch includes a power switch gate, a power switch output terminal and a power switch input terminal;
   a current path comprising a conductor,
      wherein the conductor includes an inherent impedance
      wherein the inherent impedance of the current path depends on the current path material and the current path material defines a temperature coefficient of impedance,
      wherein the current path connects the power switch output terminal to a ground terminal, and
      wherein the current path is configured to carry current between the power switch output terminal and the ground terminal;
   a first current sense terminal and a second current sense terminal,
      wherein the first current sense terminal electrically connects to the power switch output terminal, and
      wherein the second current sense terminal electrically connects to the ground terminal,
      wherein the electrical connection of the first current sense terminal and the second current sense terminal are configured to determine a voltage across the inherent impedance of the conductor without being affected by the current in the current path; and
   a temperature sensor,
      wherein the temperature sensor is configured to determine the temperature of the inherent impedance of the current path; and
a measuring unit, the measuring unit comprising a processor and a gate control output,
   wherein the gate control output connects to the power switch gate,
   wherein the measuring unit connects to the first current sense terminal, the second current sense terminal and the temperature sensor, and
   wherein the processor is configured to:
      monitor the first current sense terminal and the second current sense terminal and determine an amount of current in the current path;
      calculate the temperature of the inherent impedance of the current path based on the connection to the temperature sensor,
      determine a corrected value of the amount of current in the current path based at least in part on the temperature coefficient of impedance of the current path material;
      in response to determining the corrected value of the amount of current in the current path, control the amount of current in the current path by outputting the signals to the power switch gate.

11. The system of claim 10, and the second current sense terminal connects to the ground terminal via a leadframe terminal.

12. The system of claim 10, wherein the current path material comprises a metal or alloy composition.

13. The system of claim 10, wherein the measuring unit is configured to measure current in the current path using a four-terminal measurement, wherein terminals in the four-terminal measurement comprise the first current sense terminal, the second current sense terminal, the ground terminal and the output terminal of the power switch.

14. A method for determining a current through a power switch, the method comprising:
   monitoring, by a processor of a measuring unit, a first current sense terminal and a second current sense terminal, wherein:
      the first current sense terminal electrically connects to an output terminal of the power switch, and
      a current path connects the output terminal of the power switch to a ground terminal,
         wherein the current path comprises a conductor and the conductor includes an inherent impedance,
         wherein the inherent impedance of the current path depends on the current path material, and
         wherein the current path material defines a temperature coefficient of impedance,
      the second current sense terminal electrically connects to the ground terminal, and
   determining, by the processor, an amount of current in the current path, based on a voltage across the inherent impedance of the current path, wherein the electrical connection of the first current sense terminal and the second current sense terminal determine the voltage across the inherent impedance of the conductor without being affected by the current in the current path;
   monitoring, by the processor, a temperature sensor, wherein the temperature sensor is configured to detect the temperature of the current path;
   determining, by the processor, the temperature of the current path, based on the temperature sensor;
   in response to determining, by the processor, the temperature of the current path, further determining, by the processor, a corrected value of the amount of current in the current path based at least in part on the temperature coefficient of impedance of the current path material; and
   controlling, by the processor, the amount of current in the current path based on the corrected value.

15. The method of claim 14, wherein the power switch comprises a power switch gate, the method further comprising controlling, by the processor, the amount of current in the current path by outputting a signal to the power switch gate.

* * * * *